United States Patent [19]

Nagumo et al.

[11] Patent Number: 4,536,784

[45] Date of Patent: Aug. 20, 1985

[54] SEMICONDUCTOR DEVICE HAVING A JUNCTION CAPACITANCE, AN INTEGRATED INJECTION LOGIC CIRCUIT AND A TRANSISTOR IN A SEMICONDUCTOR BODY

[75] Inventors: Shuzo Nagumo, Koganei; Setsuo Ogura, Kodaira; Yukinori Kitamura, Mitaka, all of Japan

[73] Assignees: Hitachi, Ltd.; Hitachi Microcomputer Engineering Ltd., both of Tokyo, Japan

[21] Appl. No.: 541,445

[22] Filed: Oct. 13, 1983

Related U.S. Application Data

[63] Continuation of Ser. No. 210,813, Nov. 26, 1980, abandoned.

[30] Foreign Application Priority Data

Nov. 28, 1979 [JP] Japan .................... 54-152925

[51] Int. Cl.³ .................. H01L 27/04; H01L 27/02; H01L 29/92
[52] U.S. Cl. ........................ 357/48; 357/14; 357/51; 357/63; 357/92
[58] Field of Search ............. 357/14, 48, 51, 92, 357/63

[56] References Cited

U.S. PATENT DOCUMENTS

| | | | |
|---|---|---|---|
| 3,962,718 | 6/1976 | Inoue et al. | 357/48 |
| 4,038,680 | 7/1977 | Yagi et al. | 357/48 |
| 4,106,048 | 8/1978 | Khajezadeh | 357/13 |
| 4,202,006 | 5/1980 | Khajezadeh | 357/48 |
| 4,258,379 | 3/1981 | Watanabe et al. | 357/92 |

*Primary Examiner*—Gene M. Munson
*Attorney, Agent, or Firm*—Antonelli, Terry & Wands

[57] ABSTRACT

A semiconductor device has a diffused layer of a first conductivity type which extends to a buried layer of a second conductivity type, formed in a manner to extend from a part of a surface of a semiconductor layer of the second conductivity type which is epitaxially grown on a semiconductor substrate of the first conductivity type through the buried layer of the second conductivity type. A semiconductor junction capacitance is formed of the diffused layer of the first conductivity type and the buried layer of the second conductivity type, and the concentration of an impurity to be introduced into the buried layer of the second conductivity type is controlled.

2 Claims, 19 Drawing Figures

SEMICONDUCTOR DEVICE HAVING A JUNCTION CAPACITANCE, AN INTEGRATED INJECTION LOGIC CIRCUIT AND A TRANSISTOR IN A SEMICONDUCTOR BODY

This is a continuation of application Ser. No. 210,813, filed Nov. 26, 1980, now abandoned.

BACKGROUND OF THE INVENTION

This invention relates to a semiconductor device. More particularly, it relates to a semiconductor junction capacitance constructed as a part of a bipolar semiconductor integrated circuit (IC) and also to a semiconductor integrated circuit device including the same.

In a linear IC wherein an $n^-$-type epitaxial semiconductor layer is stacked on a p-type Si (silicon) semiconductor substrate with $n^+$-type buried layers disposed in parts between them, island regions are formed so as to be isolated from one another by p-type isolation regions which are formed in a manner to extend from the surface of the $n^-$-type layer down to the p-type substrate, and $p^+$-type bases, $n^+$-type emitters, etc., are diffused in the island regions, to thereby form n-p-n transistors. For forming a junction capacitance, either the $p^+$-$n^+$ junction between the base and the emitter of the n-p-n transistor, the $p^+$-n junction between the base and the collector, or the p-n junction between the collector and the isolation region has been employed. In the junction capacitance, the reverse breakdown voltage of the junction is inversely proportional to the capacitance per unit area. It is therefore deemed that the use of a junction having a minimum reverse breakdown voltage which can bear a maximum load voltage permitted in the circuit (IC) provides the best area efficiency in the design of the IC.

In the linear IC, usually the breakdown voltage of the base-emitter junction is approximately 6 V and that of the base-collector junction is approximately 40 V. Accordingly, the base-emitter junction or the base-collector junction has been used as may be needed. For devices requiring breakdown voltage intermediate between those of both the junctions, the base-collector junction capacitance has been employed, so that the area efficiency has been very poor.

In view of the above points, the inventors considered that a junction capacitance having a breakdown voltage intermediate between the value (6 V) of the base-emitter junction and the value (40 V) of the base-collector junction would ensure the breakdown voltage of a circuit with an area smaller than in the prior-art devices, which consideration led them to this invention.

Further, the inventors have taken into account the provision of a semiconductor integrated circuit device which is formed without adversely affecting other elements during the formation of the junction capacitance as described above, and also a method of producing the same.

BRIEF SUMMARY OF THE INVENTION

A first object of this invention is to provide a junction capacitance which can ensure a breakdown voltage required in an IC and whose area efficiency is good.

A second object of this invention is to provide a semiconductor integrated circuit device which includes the junction capacitance as described above.

A third object of this invention is to provide a method of manufacturing the semiconductor integrated circuit device as described above.

DESCRIPTION OF THE PREFERRED EMBODIMENTS

Figure 1:
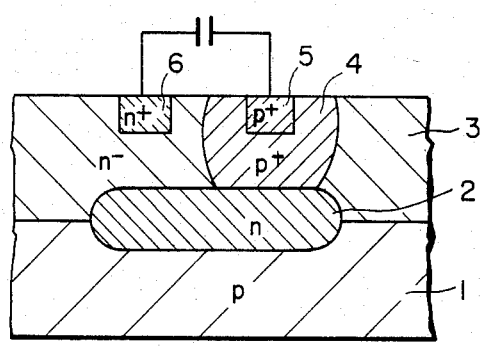
FIG. 1 is a sectional view showing the principal construction of a junction capacitance according to this invention.

FIG. 1 shows the principal structure of this invention. Referring to the Figure, numeral 1 designates a p-type silicon (Si) substrate. An n-type buried layer 2 is formed in such a way that phosphorus (P), for example, is ion-implanted into the surface of the p-type substrate 1 at a proper impurity concentration or deposited thereon and is thereafter diffused into the surface, so as to convert the surface part into an n-type region, whereupon an $n^-$-type epitaxial layer 3 is grown on the substrate.

Numeral 4 designates a $p^+$-type diffused layer which is formed by selectively diffusing boron (B) from the surface of the $n^-$-type epitaxial layer 3 so as to extend to the n-type buried layer 2. The $p^+$-type diffused layer 4 utilizes $p^+$-type diffusion at the time when isolation regions 8 (FIG. 2) for isolating the $n^-$-type epitaxial layer 3 into several island regions are formed in a linear IC. Numeral 5 indicates a $p^+$-type diffused layer for leading out an electrode from the $p^+$-type diffused layer 4, while numeral 6 indicates an $n^+$-type diffused layer for leading out an electrode from the $n^-$-type epitaxial layer 3. In such a structure, the p-n junction between the n-type buried layer 2 and the $p^+$-type diffused layer 4 is used as a capacitance. Thus, a capacitance which has a breakdown voltage intermediate between the breakdown voltage (approximately 6 V) of the base-emitter junction and that (approximately 40 V) of the base-collector junction can be freely produced by controlling the impurity concentration of the n-type buried layer 2.

Figure 2:
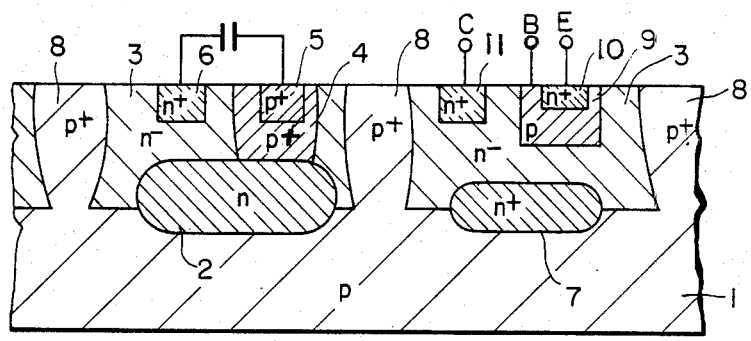
FIG. 2 is a sectional view showing an example in the case where this invention is applied to a linear IC.

FIG. 2 shows an example in the case where the junction capacitance of this invention is assembled in a part of a linear circuit having n-p-n transistors. An $n^-$-type epitaxial layer 3 is formed on a p-type substrate 1 with an $n^+$-type buried layer 7 and an n-type buried layer 2 which has an impurity concentration lower than that of the $n^+$-type buried layer 7 partially extending to separate portions of layer 3 and substrate 1, as shown. The $n^-$-type epitaxial layer 3 is isolated into a plurality of $n^-$-type island regions by $p^+$-type isolation regions 8. Among the plurality of island regions, the island region formed with the $n^+$-type buried layer 7 has an n-p-n transistor formed therein, while the island region formed with the n-type buried layer 2 has a junction capacitance, as shown in FIG. 1, formed therein.

FIGS. 3(a) through 3(e) illustrate various steps of an embodiment of a manufacturing process in the case of forming a p-n junction capacitance in a linear circuit in accordance with this invention.

Figure 3A:
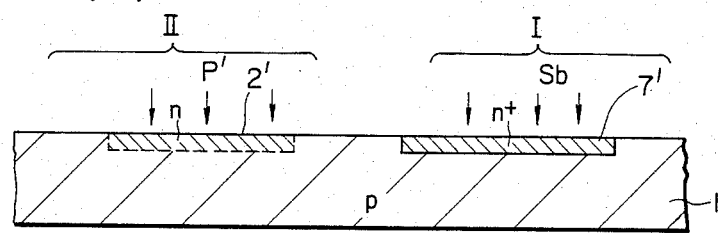
FIGS. 3(a) through 3(e) are sectional views showing various steps of a process for manufacturing the IC of FIG. 2.

First, as shown in FIG. 3(a), a p-type silicon (Si) substrate 1 is prepared. In one region I of the surface of the substrate, antimony (Sb) is deposited and then diffused to thereby form an n+-type Sb-doped layer 7'. The other region II of the surface of the substrate is doped with phosphorus (P) by ion implantation or deposition at an impurity concentration lower than that of the antimony, to form an n-type P-doped layer 2'. (Hereinbelow, this shall be termed the "CNH doping method".)

Figure 3B:
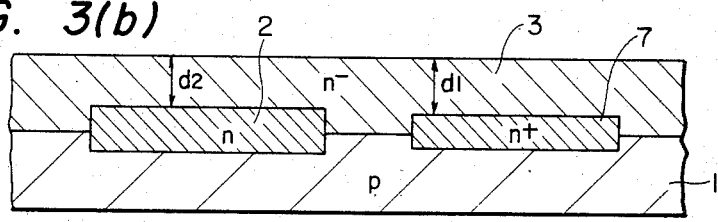

Subsequently, as shown in FIG. 3(b), an n−-type epitaxial layer 3 doped with an n-type impurity (P or Sb) at a low concentration is formed, and the Sb-doped layer 7' and the P-doped layer 2' are caused to respectively extend into layer 3 so as to be buried in substrate 1 and layer 3 to form an n+-type buried layer 7 in the region I and an n-type buried layer 2 in the region II. In the N+-type buried layer 7 and the n-type buried layer 2 formed by the CNH doping method, the buried layer 2 extends into layer 3 to a greater degree because the diffusion rate of P is greater than that of Sb. Accordingly, the thickness of the n−-type epitaxial layer 3 on the n+-type buried layer 7 is $d_1 = 6-7$ μm, whereas the thickness of the n−-type epitaxial layer 3 on the n-type buried layer 2 becomes $d_2 = 4-5$ μm. The Sb impurity concentration of the n+-type buried layer 7 is $1 \times 10^{19}$ cm$^{-3}$, while the P impurity concentration of the n-type buried layer 2 formed by the CNH doping method can be properly selected between $1 \times 10^{16} - 1 \times 10^{19}$ cm$^{-3}$, in accordance with a required breakdown voltage.

Figure 3C:
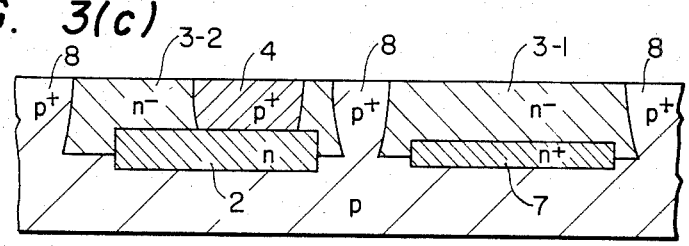

Subsequently, as shown in FIG. 3(c), boron (B) is diffused from the surface of the n−-type epitaxial layer 3, to form a p+-type isolation region 8 which isolates the n−-type epitaxial layer 3 into a plurality of island regions 3-1 and 3-2. At the same time as the formation of the region 8, a p+-type diffused region 4 extending to the n-type buried layer 2 is formed in the island region 3-2. That is, the p+-type region 4 is formed by the same diffusion process for forming the isolation region 8.

Figure 3D:
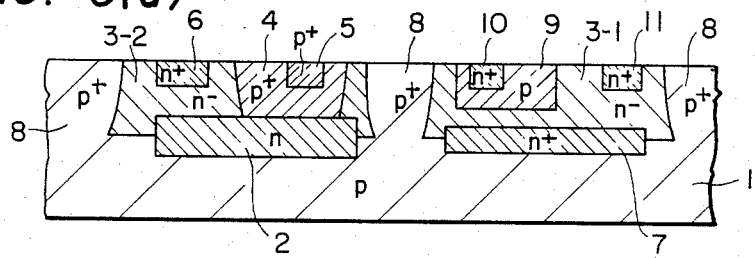

Thereafter, as shown in FIG. 3(d), a p-type impurity is diffused into the island regions 3-1 and 3-2 to thereby respectively form a p+-type base region 9 and a p+-type region 5 for leading out an electrode. Further, an n-type impurity is diffused into the island regions 3-1 and 3-2 at a high concentration to thereby form an n+-type emitter region 10, and an n+-type region 11 for leading out a collector electrode in the island region 3-1, and also an n+-type region 6 for leading out an electrode in the island region 3-2. Thus, an n-p-n transistor is formed in the island region 3-1, and a junction capacitance defined by the p-n junction between the p+-type region 4 and the n-type buried layer 2 is formed in the island region 3-2.

Figure 3E:
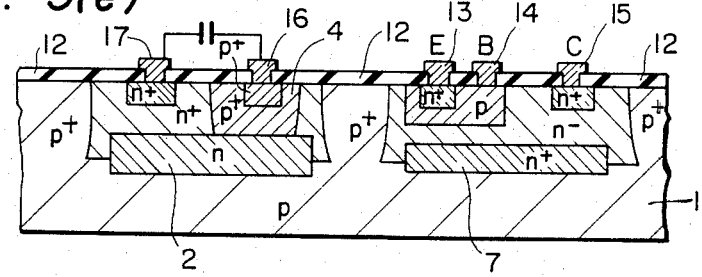

Subsequently, as shown in FIG. 3(e), on an oxide film 12 (omitted from FIGS. 3(a) through 3(d)) overlying the island regions 3-1 and 3-2, aluminum (Al) is evaporated by performing contact photoetching. After selectively etching the aluminum (Al) using a conventional photoresist technique, the electrodes, 13, 14, 15, 16, and 17 connected with the respective contact portions 10, 9, 11, 5 and 6 are formed.

In accordance with the above process of manufacture, a predetermined junction capacitance is formed by employing the n-type buried layer 2 which has a lower impurity concentration than the n+-type buried layer 7 interposed between the p-type substrate 1 and the island region 3-1 formed with the n-p-n- transistor, so that the object of this invention can be accomplished without increasing the collector resistance ($R_{cs}$) of the n-p-n transistor. This is very meritorious in fabricating linear ICs.

Figure 4:
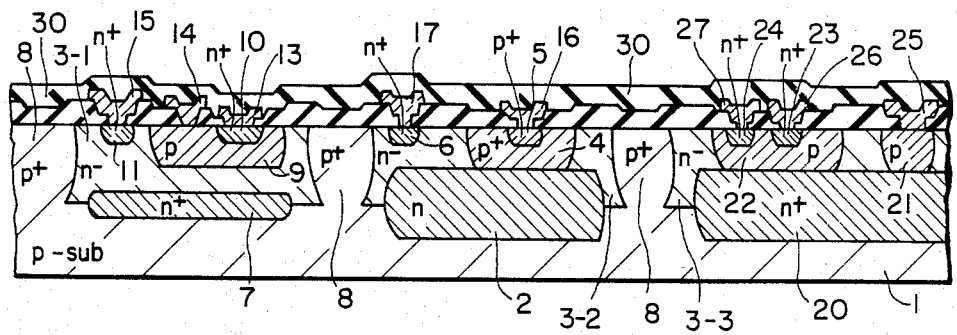
FIG. 4 is a sectional view of an IC showing another embodiment of this invention.

FIG. 4 shows a section of a semiconductor integrated circuit device in which a p-n junction capacitance, a bipolar transistor and an I$^2$L element are formed in an identical substrate in accordance with this invention. Referring to the figure, numeral 1 designates a p-type substrate which has an impurity concentration of approximately $4 \times 10^{14}$ cm$^{-3}$. Numeral 8 designates an isolation region which isolates an n−-type epitaxial layer formed on the substrate 1, into a plurality of island regions (3-1, 3-2, 3-3). The impurity concentration of the isolation region 8 is approximately $3 \times 10^{19}$ cm$^{-3}$. The impurity concentration of the respective island regions (3-1, 3-2, 3-3) is approximately $5 \times 10^{15}$ cm$^{-3}$. Buried layers of the n+-type or n-type 7, 2, and 20 extend in to the respective island regions 3-1, 3-2, and 3-3 and portions of the p-type substrate 1. The impurity concentration of the n+-type buried layer 7 is approximately $5 \times 10^{18}$ cm$^{-3}$, that of the n-type buried layer 2 is approximately $1 \times 10^{18}$ cm$^{-3}$, and that of the n+-type buried layer 20 is approximately $6 \times 10^{18}$ cm$^{-3}$.

In the island region 3-1, there are formed a p-type base region 9 having an impurity concentration of approximately $5 \times 10^{18}$ cm$^{-3}$ and an n+-type emitter region 10 having an impurity concentration of approximately $3 \times 10^{20}$ cm$^{-3}$. An n-p-n transistor is constructed of the n+-type region 10, the p+-type region 9 and the n−-type island region 3-1.

In the island region 3-2, a junction capacitance defined by the p+-n junction between a p+-type region 4 and the n-type buried layer 2 is constructed. The impurity concentration of the p+-type region 4 is approximately $3 \times 10^{19}$ cm$^{-3}$.

In the island region 3-3, there are formed a p-type injection region 21, a p-type base region 22, and n+-type collector regions 23 and 24. An integrated injection logic (I$^2$L) circuit is constructed of the p-type region 21, and n−-type island region 3-3, the n+-type buried layer 20, the p-type region 22, and the n+-type regions 22 and 23. Electrodes 13, 14, and 15, electrodes 16 and 17, and electrodes 25, 26, and 27 are respectively connected to regions 10, 9, and 11 of the n-p-n transistor, regions 5 and 6 of the junction capacitance, and regions 21, 23, and 24 of the I$^2$L circuit. A passivation film 30 is formed on the surface of the semiconductor device. For this purpose, any one of, for example, a phosphosilicate glass (PSG) film, an SiO$_2$ film formed by the chemical vapor deposition (CVD) technique, or a polyimide resin film may be used.

Figure 5A:
FIGS. 5(a) through 5(j) are sectional views showing various steps of a process for manufacturing the IC of FIG. 4.
Figure 5B:
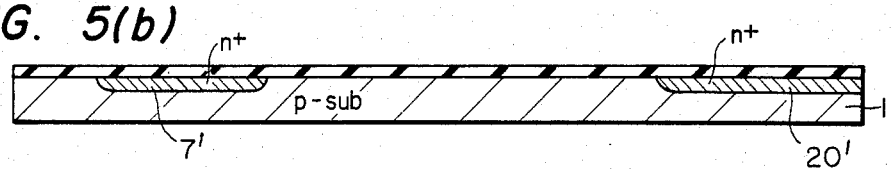
Figure 5C:
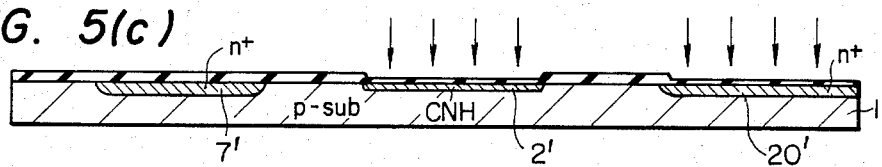
Figure 5D:
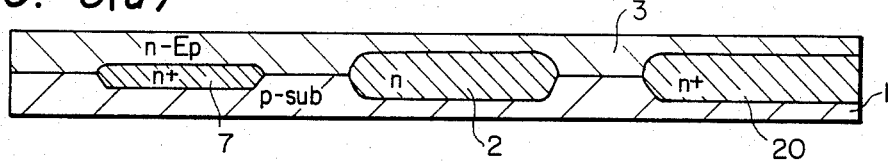
Figure 5E:
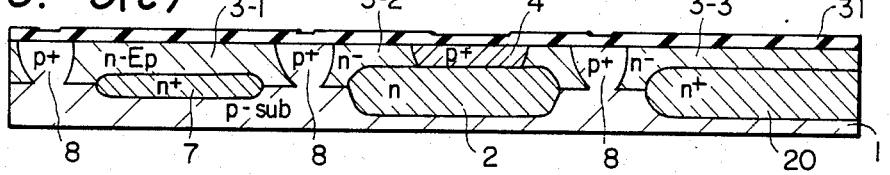
Figure 5F:
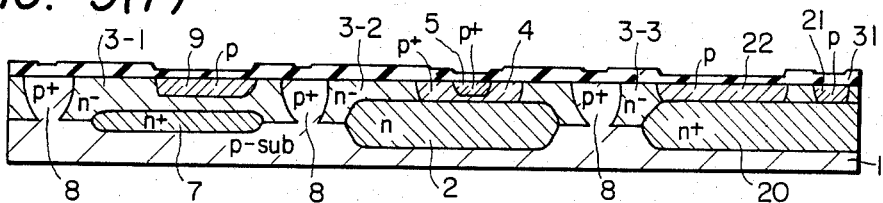
Figure 5G:
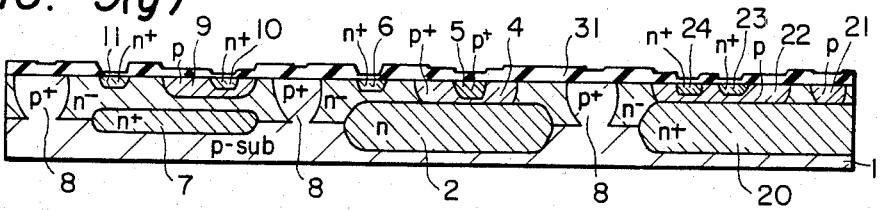
Figure 5H:
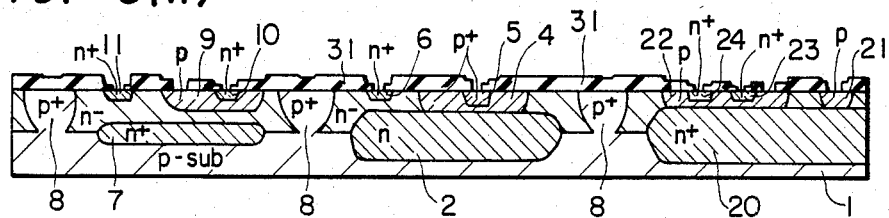
Figure 5I:
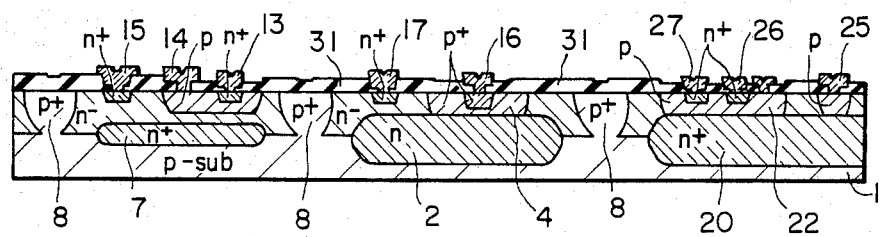
Figure 5J:
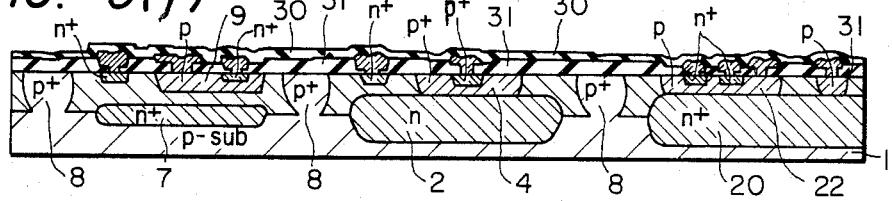

A process for manufacturing the semiconductor integrated circuit device shown in FIG. 4 will be described with reference to FIGS. 5(a) through 5(j). First, as shown in FIG. 5(a), a p-type substrate 1 having an overlying passivating film is prepared. As shown in FIG. 5(b), n+-type regions 7' and 20' are formed in selected parts of the surface of the substrate 1 by depositing an n-type impurity on the surface of the substrate and then diffusing the impurity into the substrate. As shown in FIG. 5(c), a part of the surface of the p-type substrate 1 between the n+-type region 7' and the n+-type region 20', and the surface of the n+-type region 20' itself are doped with phosphorus (P) by an ion implantation process, to form P-doped layers (CNH doping layers) 2' and 20'. Subsequently, as shown in FIG. 5(d), an n-type epitaxial layer 3 at an impurity concentration of approximately $5 \times 10^{15}$ cm$^{-3}$ is formed on the surface of that side of the substrate 1 on which the n+-type region 7' and the CNH doping layers 2' and 20' are formed. At this time, the n+-type impurity in the n+-type region 7' and the CNH doping layers 2' and 20' diffuse into the epitaxial layer 3 and the substrate 1, so that an n+-type buried layer 7, an n-type buried layer 2, and an n+-type buried layer 20 are formed. At the next step, as shown in FIG. 5(e), a p-type impurity is introduced into the surface of the n-type epitaxial layer 3 to thereby form a plurality of isolation regions 8, each having an impurity concentration of approximately $3 \times 10^{19}$ cm$^{-3}$. The isolation regions 8 isolate the n-type epitaxial layer 3 into a plurality of island regions 3-1, 3-2, 3-3. During the formation of the isolation regions 8, a p+-type region 4 extending to the n-type buried layer 2 is simultaneously formed in the island region 3-2. The p+-n junction between the p+-type region 4 and the n-type buried layer 2 forms a junction capacitance. Subsequently, as shown in FIG. 5(f), the island regions 3-1, 3-2, and 3-3 are respectively doped with a p-type impurity to form a p-type base region 9, a p+-type electrode leading-out region 5, and a p-type base region 22 as well as a p-type injection region 21 at the same time. The impurity concentration of each of the respective p-type regions is approximately $5 \times 10^{18}$ cm$^{-3}$. Subsequently, as shown in FIG. 5(g), the respective island regions 3-1, 3-2, and 3-3 are doped with an n-type impurity to form a collector electrode leading-out n+-type region 11 and an emitter region 10, an n+-type electrode leading-out region 6, and n+-type collector regions 23 and 24. The impurity concentration of each of the respective n+-type regions is approximately $3 \times 10^{20}$ cm$^{-3}$. Thereafter, as shown in FIG. 5(h), selected parts of an insulating film 31 on the island regions are removed by the conventional photoresist technique, to thereby provide contact windows for the p-type and n+-type regions. Subsequently, as shown in FIG. 5(i), metal electrodes 13, 14, 15, 16, 17, 25, 26, and 27 connected to the p-type and n+-type regions through the contact windows are formed. In forming these electrodes, a conventional evaporation technique and a photoresist technique are used. At the next step, as shown in FIG. 5(j), a protective film 30 is formed on the metal electrodes and the insulating film 31. As the protective film 30, a phosphosilicate glass film or $SiO_2$ film formed by a chemical vapor deposition technique, or a polyimide resin film is employed. In accordance with such a method of manufacture, the CNH doping method used at the formation of the I$^2$L circuit is utilized for forming the junction capacitance, so that the junction capacitance having a predetermined breakdown voltage and a good area efficiency can be fabricated without increasing the number of manufacturing steps.

According to the construction and manufacturing processes of this invention described above in connection with the embodiments, the objects of this invention can be accomplished for the following reasons:

(1) An n-type buried layer formed by the CNH doping method has a lower impurity concentration than a conventional n+-type buried layer in a linear IC. Therefore, the breakdown voltage of the p-n junction between the n-type buried layer and a p-type region which is formed simultaneously with an isolation region can be established at a desired value by properly selecting the impurity concentration of the n-type buried layer.

(2) In the conventional linear IC, the p-n+ junction the n+-type buried layer and the isolation region can be utilized as a capacitance. In that case, however, the breakdown voltage is fixed to approximately 6 to 8 V. If the n+-type concentration is lowered by changing the quantity of the impurity of Sb at the formation of the n+-type buried layer, it will be possible to raise the breakdown voltage of the junction capacitance. This measure, however, cannot be adopted because the collector resistance $R_{cs}$, etc., of the n-p-n transistor are adversely affected. In contrast, with the CNH doping method, the impurity concentration of the n-type buried layer can be freely varied, and an element whose Zener voltage can be freely selected can be formed in that case.

(3) As understood from the manufacturing process in FIGS. 5(a) through 5(j), the CNH doping method is deemed to be effective when utilized for forming an inverse n-p-n transistor of an I$^2$L circuit. The formation of the capacitance according to this invention can be readily applied to an I$^2$L process in which the step of the CNH doping is carried out between the step of diffusing the n+-type buried layer and the step of epitaxial growth in a standard linear process.

(4) Where the ion implantation, especially of the impurity of phosphorus, is adopted for the formation of the n-type buried layer based on the CNH doping method, the impurity concentration can be accurately controlled by controlling the implantation energy, and a desired breakdown voltage can be precisely varied.

(5) Since the n-type buried layer formed by the CNH doping method can provide various concentrations, prescribed breakdown voltages can be ensured in various circuits, and a capacitance can be efficiently formed in a small area without especially increasing the space.

Figure 6:
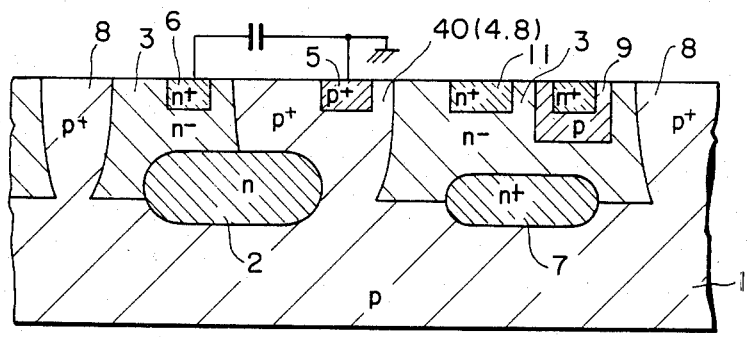
FIG. 6 is a sectional view of an IC showing still another embodiment of this invention.

This invention is not restricted to the foregoing embodiments, but it affords various modified embodiments. For example, for a circuit as shown in FIG. 6, wherein one side, e.g. a p-type region of a capacitance employing the p-n junction between an n-type buried layer which is formed by the CNH doping method and the p-type region which is formed simultaneously with an isolation region is grounded, a p-type region 40 into which the p-type region 4 for the junction capacitance and the isolation region 8 are unified can be formed as shown, to serve for forming the capacitance and also for isolating island regions. Further, the CNH doping method may use antimony as well. In this case, the n-type buried layer must have an impurity concentration lower than that of an n+-type buried layer 7 constituting an n-p-n transistor. The p-type region 4 of the junction capacitance may well be formed simultaneously with the formation of a p-type region 22 of an I$^2$L circuit. In this case, although a desired breakdown voltage can be attained, the concentration of the p-type region 4 becomes low, and hence, the area efficiency is not so good as in the cases of the foregoing embodiments.

This invention is applicable, not only to linear circuits, but also to digital circuits and to all bipolar ICs. It is also applicable to MOS-ICs.

What is claimed:

1. A semiconductor device having a junction capacitance, an integrated injection logic circuit and a transistor in a semiconductor body, comprising:
- a semiconductor layer of a first conductivity type which is formed on a semiconductor substrate of a second conductivity type opposite to said first conductivity type,
- an isolation region which extends from a surface of said semiconductor layer to said substrate and which isolates said semiconductor layer into a first island region, a second island region, and a third island region,
- a first semiconductor buried layer of said first conductivity type which is located between said first island region and said substrate, said first semiconductor buried layer having a higher impurity concentration than said first island region,
- a second semiconductor buried layer of said first conductivity type which is located between said second island region and said substrate and which has an impurity concentration lower than that of said first semiconductor buried layer, said second semiconductor buried layer having a thickness greater than that of said first semiconductor buried layer,
- a third semiconductor buried layer of said first conductivity type which is located between said third island region and said substrate, and which has an impurity concentration higher than that of said first buried layer,
- a first semiconductor region of a second conductivity type which is selectively formed in said second island region and is contacted with said second semiconductor buried layer,
- second and third semiconductor regions of said second conductivity type which are formed in said third island region in a manner to be spaced from each other,
- a fourth semiconductor region of said first conductivity type which is formed in said second semiconductor region,
- a fifth semiconductor region of said second conductivity type which extends from a surface of said first island region toward but is separated from said first buried layer, and
- a sixth semiconductor region of said first conductivity type which is formed in said fifth semiconductor region,
- a junction capacitance being formed by a PN junction between said first semiconductor region and said second semiconductor buried layer,
- an integrated injection logic circuit being constructed of said third semiconductor buried layer, said third island region, said second semiconductor region, said third semiconductor region and said fourth semiconductor region,
- a transistor being constructed of said first island region, said fifth semiconductor region and said sixth semiconductor region, and wherein said first semiconductor buried layer contains a first impurity for defining said first conductivity type, said second semiconductor buried layer contains a second impurity for defining said first conductivity type and said third semiconductor buried layer contains said first and second impurities.

2. A semiconductor device according to claim 1, wherein said isolation region and said first semiconductor region have the same impurity concentration.

* * * * *